United States Patent [19]

Shiota et al.

[11] Patent Number: 5,093,311
[45] Date of Patent: Mar. 3, 1992

[54] OXIDE SUPERCONDUCTOR CABLE AND METHOD OF PRODUCING THE SAME

[75] Inventors: Takao Shiota, Sakura; Hiroshi Hidaka, Tsukuba; Koichi Takahashi, Funabashi; Masahiro Sato, Yotsukaido; Osamu Fukuda, Narashino; Koichi Inada, Sakura, all of Japan

[73] Assignee: Fujikura Ltd., Tokyo, Japan

[21] Appl. No.: 178,264

[22] Filed: Apr. 6, 1988

[30] Foreign Application Priority Data

| Apr. 6, 1987 | [JP] | Japan | 62-85152 |
| Apr. 6, 1987 | [JP] | Japan | 62-85153 |
| Apr. 6, 1987 | [JP] | Japan | 62-85154 |
| Apr. 28, 1987 | [JP] | Japan | 62-105570 |

[51] Int. Cl.$^5$ .............................................. B32B 9/00
[52] U.S. Cl. ........................................ 505/1; 505/701; 505/702; 505/703; 505/704; 428/332; 428/334; 428/426; 428/433; 428/357; 428/688; 428/658; 428/930
[58] Field of Search ............................. 505/1, 701–704; 428/688, 557, 930, 332, 334, 698, 426, 433; 29/599

[56] References Cited

U.S. PATENT DOCUMENTS 4,826,808  5/1989  Yurek et al. ........................... 505/1

OTHER PUBLICATIONS

Fabrication of Dense $Ba_2YCu_3O_{7-\delta}$ Superconductor Wire by Molten Oxide Processing, Appl. Phys. Letter vol. 51 (12), 9-21-87, Jin et al.
High Temp Superconductivity, Gan et al., Int. Journ. Mod. Phys. B, vol. 1, No. 2 Jul. 1, 1987.
Applied Phys. Letts, 51(17), 8/87, Yan et al., pp. 532-534.
Applied Phys. Letts, 51 (14), 10/87, Meyer III et al., pp. 1118-1120.
Abs. No. 89-002869 Sanyo Electric KK.

*Primary Examiner*—Patrick J. Ryan
*Attorney, Agent, or Firm*—Oblon, Spivak, McClelland, Maier & Neustadt

[57] ABSTRACT

An oxide superconductor cable and a method of producing the same. The oxide superconductor cable includes a ceramic fiber and an oxide superconductor layer coated over the ceramic fiber. Such a structure of the cable provides flexibility to it to some extent and enables it to become relatively thin.

9 Claims, 5 Drawing Sheets

OXIDE SUPERCONDUCTOR CABLE AND METHOD OF PRODUCING THE SAME

BACKGROUND OF THE INVENTION

The present invention relates to an oxide superconducting cable and method of producing the same, which may be used, for example, for communication cables using superconductivity, superconducting magnet coils, and superconducting power transmission cables.

Various attempts have been made to produce a rod like oxide superconductor by extrusion molding a molten amorphous superconducting material, cooling and then heating it in an oxygen atmosphere.

However, such an oxide superconductor has not sufficient flexibility for practical use as a cable. Furthermore, it is difficult to fabricate a thin cable of such an oxide superconductor.

Accordingly, it is an object of the present invention to provide an oxide superconductor cable and a method of producing the superconducting cable which is fairly thin and flexible as compared to the prior art oxide superconductor.

It is another object of the present invention to provide a method of fabricate an oxide superconductor cable with ease.

SUMMARY OF THE INVENTION

In view of these and other objects, the present invention provides an oxide superconductor cable comprising a ceramic fiber and an oxide superconductor layer coated over the ceramic fiber. Such a construction of the cable provides flexibility to it to some extent and enables it to become relatively thin.

DETAILED DESCRIPTION OF THE PREFERRED EMBODIMENTS

Figure 1:
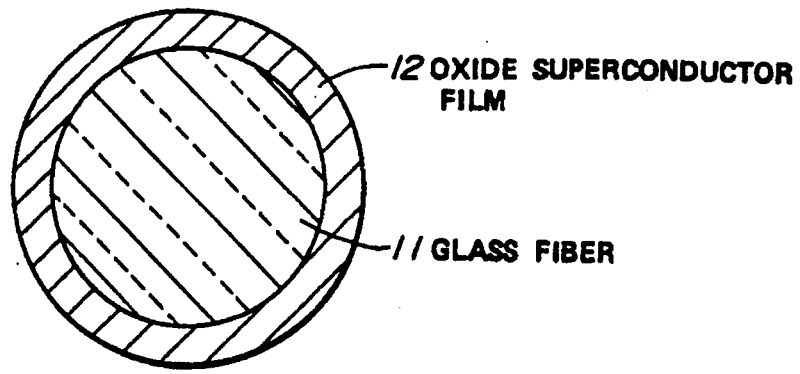
FIG. 1 is a diagrammatic cross-sectional view of an oxide superconducting cable fabricated according to the present invention.

Referring to FIG. 1, an oxide superconductor cable of the present invention has a glass fiber 11 coated with an oxide superconductor film 12. In this embodiment, the glass fiber 11 is formed by spinning a silica glass into a fiber of 125 μm diameter. The oxide superconductor film 12 is made of an oxide superconductor $Ba_{0.6}Y_{0.4}CuO_4$ and has a thickness of 0.5 μm.

The glass fiber 11 may be made of a silica glass which includes 90 wt % or more of $SiO_2$ and further contains $GeO_2$, $B_2O_3$, $P_2O_3$, etc, and a conventional multi-component glass which includes $SiO_2$, $Na_2O$, $B_2O_3$, etc, and a similar glass and a ceramic.

The superconducting film 12 may be of other oxide superconductors such as La-Sr-Cu-O system and Ca-La-Cu-O system instead of Ba-Y-Cu-O system. More generally, the superconductor which is used in the present invention may be generally represented by the formula:

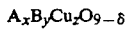

$$A_xB_yCu_zO_{9-\delta}$$

where: A includes at least one element of IIIa group, i.e. Sc, Y, La, Ce, Pr, Nd, Pm, Sm, Eu, Gd, Tb, Dy, Ho, Er, Tm, Yb and Lu; B includes at least one element of IIa group, i.e. Be, Sr, Mg, Ca, Ba and Ra; $0.1 \leq x \leq 2.0$; $1 \leq y \leq 3$; $1 \leq z \leq 3$; and $0 \leq \delta \leq 7$. Specifically, the Y-Ba-Cu-O system should be rhombic and typically $x=1$, $y=2$, $z=3$ and $2 \leq \delta \leq 3$. In the $(La_{2-k}Ba_k)CuO_4$ system, preferably $0 < k < 0.3$.

In the present invention, the glass fiber 11 may be fabricated by the conventional crucible drawing technique, lot drawing technique and a similar method and then coated with the oxide superconductor film 12. Such coating may be made by conventional methods such as, continuous sputtering, vacuum deposition, MBE, chemical vapor deposition (CVD) or MOVCD, and technique of decomposition of an alkoxide of each element of a superconductor. Furthermore, the film 12 may be formed by oxidizing a material applied over the glass fiber 11 by the above methods. Sputtering provides a uniform single crystal film over a thin glass fiber with ease. The thickness of the superconducting film made of systems above named by the current sputtering technique may be about 0.1 to about 5 μm.

In an alternative method of forming the oxide superconductor film 12, an oxide superconductor material film may be coated over the glass fiber 11 and then the material film may be oxidized in an active oxygen plasma gas to produce the oxide superconductor film 12. The oxidization of the material film may be made in such an atmosphere which is produced by generating direct current plasma or high frequency plasma at a vacuum level of $10^{-1}$ to $10^{-4}$ Torr and then by introducing oxygen gas. Then, the oxide superconductor film 12 and the flass fiber 11 are cooled.

Additionally, a protecting layer of silicone, an organic compound, such as ultraviolet-setting epoxy acrylate resin, and similar material may be conventionally coated over the oxide superconductor film 12 for protecting the latter. The protecting layer according to the present invention is typically about 10 to about 100 μm in thickness.

When the glass fiber 11 is an optical fiber for communication, the superconducting cable may be used for both communication and power supply.

Figure 4:
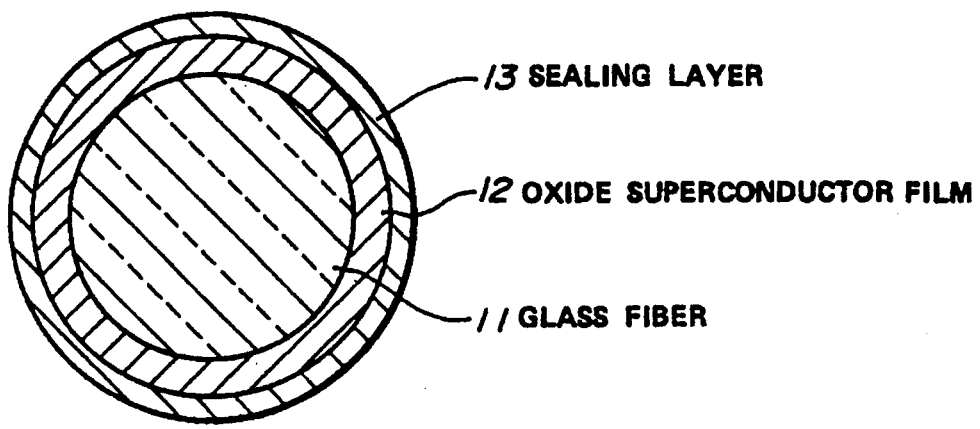
FIG. 4 is a diagrammatic cross-sectional view of a modified form of the sueperconducting cable in FIG. 1.

The superconducting cable in FIG. 4 is distinct from the superconducting cable in FIG. 1 in that it is coated with a sealing layer 13 over the oxide superconductor thin film 12. The sealing layer 13 serves to hermetically seal the thin film 12 against the atmosphere for preventing $O_2$, $H_2O$, $CO_2$, etc from permeating into and adhering to the thin film so that the superconductor may keep its performance after sputtering. The forming of the sealing layer 13 is preferably formed immediately after the production of the superconductor film 12 since the surface of the latter is active just after the production thereof and is liable to react on existing gases.

Instead of silica, the sealing layer 13 may be made of various kinds of glasses, such as optical glass and silica glass, or metals such as In, Ag, Cu, Ni and Au. The sealing layer 13 may be formed by conventional methods such as sputtering and other similar methods for forming the oxide superconductor layer 12. When the sealing layer 13 is made of a metal, it is coated over the oxide superconductor layer 12 by sputtering, hot dipping and CVD. According to the present invention, the sealing layer made of materials above named may be about 0.02 to about 50 $\mu$m in thickness. A thickness smaller than about 0.02 $\mu$m may provide insufficient sealing performance to the sealing layer. The hot dipping provides the upper limit and sputtering may form a sealing layer of a thickness up to about 5 $\mu$m.

Also in this modified superconducting cable, a protecting layer of silicone, organic compounds or a like material may be formed over the sealing layer 13.

Figure 5:
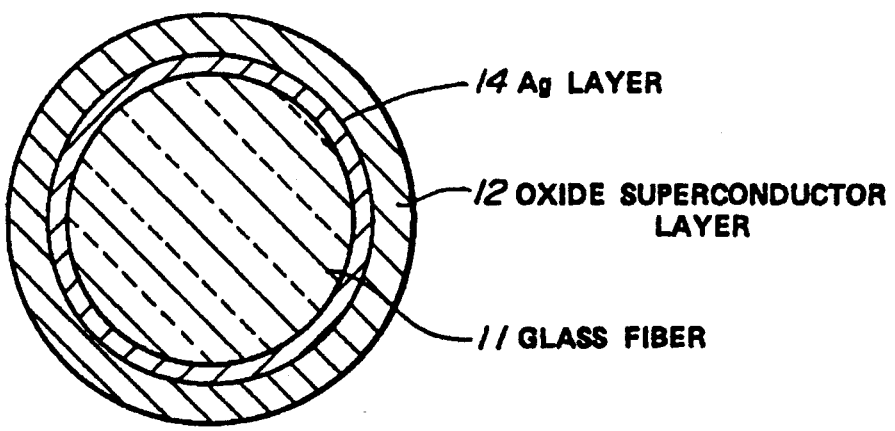
FIG. 5 is a diagrammatic cross-sectional view of another modified form of the superconducting cable in FIG. 1.

An improved form of the superconductor cable in FIG. 1 is illustrated in FIG. 5, in which the glass fiber 11 is coated with a nonoxidizing layer 14 of Ag, over which is coated the oxide superconductor layer 12. The non-oxidizing layer 14 serves to prevent elements of the oxide superconductor from reacting with components of the glass fiber 11 during heat treatment of the oxide superconductor, thus enhancing performance, e.g. critical temperature and critical current density, of the superconductor. Particularly, the non-oxidizing layer 14 prevents oxygen in the oxide superconductor from being taken away by the glass fiber 11.

The non-oxidizing layer 14 may be made of noble metals, such as Ag, Au, Pt, Ru, Rh, Pd, Os and Ir, other than Ag and noble metal alloys such as Ag alloys and Au alloys. Furthermore, the non-oxidizing layer 14 may be made of other conventional non-oxidizing materials. The thickness of the non-oxidizing layer 14 is generally about 0.5 $\mu$m to about 5 $\mu$m and preferably about 1 $\mu$m. With less than about 0.5 $\mu$m, the reaction between the oxide superconductor and the glass fiber 11 may not sufficiently be prevented and the non-oxidizing layer of a thickness larger than 5 $\mu$m is liable to separate from the glass fiber 11.

The non-oxidizing layer 14 may be formed by conventional surface treatment techniques such as chemical vapor deposition, vacuum deposition, sputtering and dipping.

Figure 6:
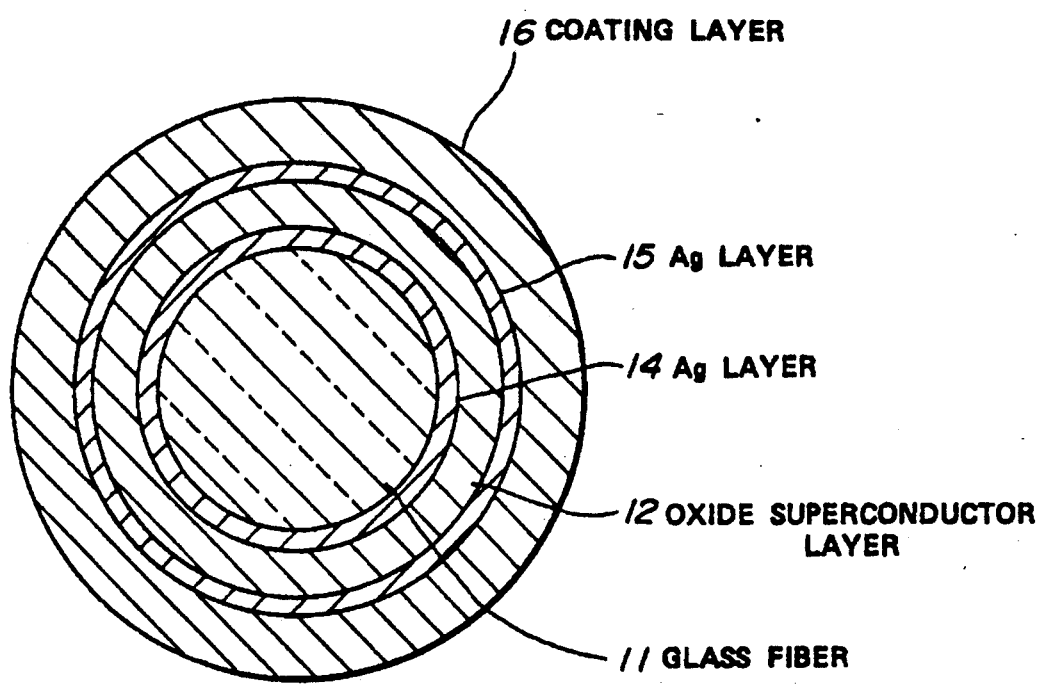
FIG. 6 is a diagrammatic cross-sectional view of a modified form of the superconductor cable of FIG. 5.

A modified form of the superconductor cable in FIG. 5 is illustrated in FIG. 6, in which the oxide superconductor layer 12 is coated with an oxidizing coating layer 16, such as a reinforcing layer or a stabilizing layer. Through another non-oxidizing layer 15 of Ag. The Ag layer 15 serves to prevent oxygen from diffusing from the superconductor layer 12 into the coating layer 16.

Figure 7:
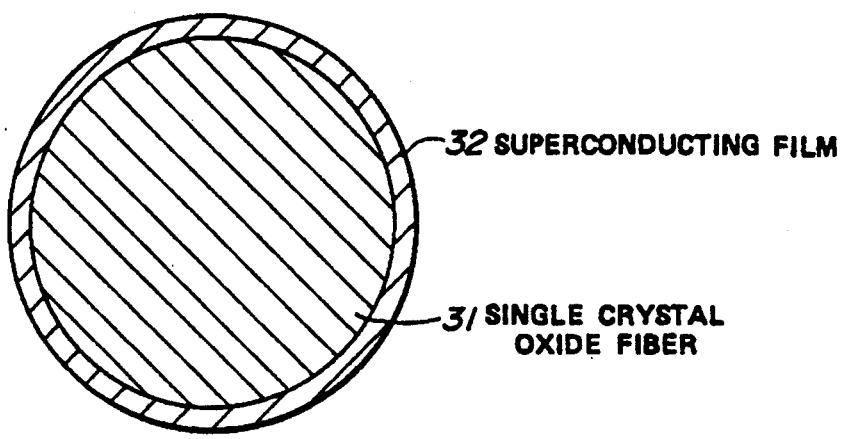
FIG. 7 is a diagrammatic cross-sectional view of another modified form of the superconductor cable in FIG. 1.

FIG. 7 illustrates a modified form of the superconducting cable in FIG. 1. In this modified superconducting cable, a single crystal oxide fiber 31 is coated with an oxide superconductor film 32. The single crystal structure of the fiber 31 provides an excellent effect in producing a uniform single crystal structure of the superconductor thin film 32.

Figure 8:
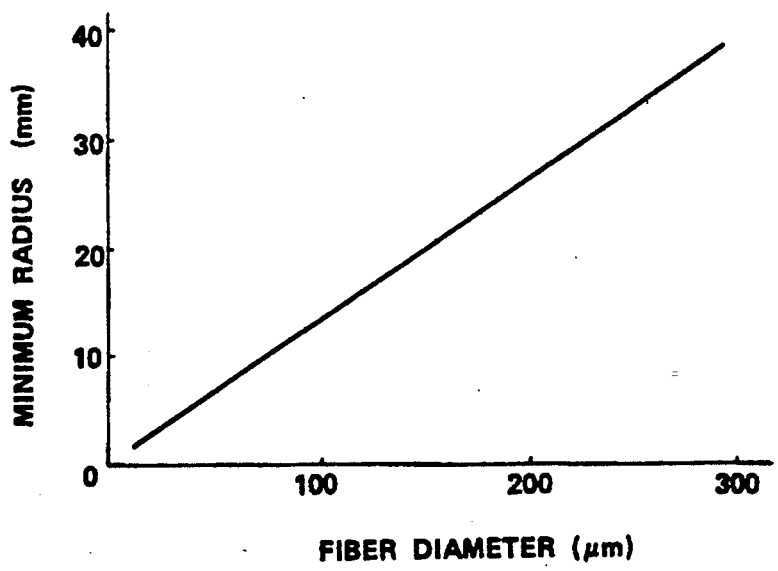
FIG. 8 is a graph showing the relationship between the diameter of a single crystal oxide fiber used in the superconductor cable in FIG. 7 and the minimum bending radius thereof.

The single crystal oxide fiber 31 may be $Al_2O_3$, $TiO_2$, $ZrO_2$, yttrium-aluminum-garnet (YAG) and other conventional materials. The diameter of the fiber 31 is preferably about 20 $\mu$m to about 300 $\mu$m. With a diameter smaller than about 20 $\mu$m, it may be hard to handle it in production of the superconductor cable and beyond about 300 $\mu$m it may not sufficiently be bent. FIG. 8 illustrates the relationship between the diameter of a sapphire single crystal fiber and the minimum radius of its loop which may be formed without breaking it. Such a thin single crystal oxide fiber 31 may be produced by $CO_2$ laser pulling technique, Edge-defined Film Fed Growth (EFG) technique or a similar conventional technique.

The superconductor film 32 preferably has a thickness less than about 2 $\mu$m for preventing separation from the fiber 31 although it may have a thickness about 5 $\mu$m. The superconductor film 32 may be formed in the same manner as the film 12.

The present invention may be applied to a multifilament type superconducting cable by assembling a plurality of single superconductor cables of the preceding embodiments in a sheath. The superconductor cable according to the present invention may have a rectangular cross-section or a like configuration and furthermore it may be in a tape shape.

EXAMPLE 1

Figure 2:
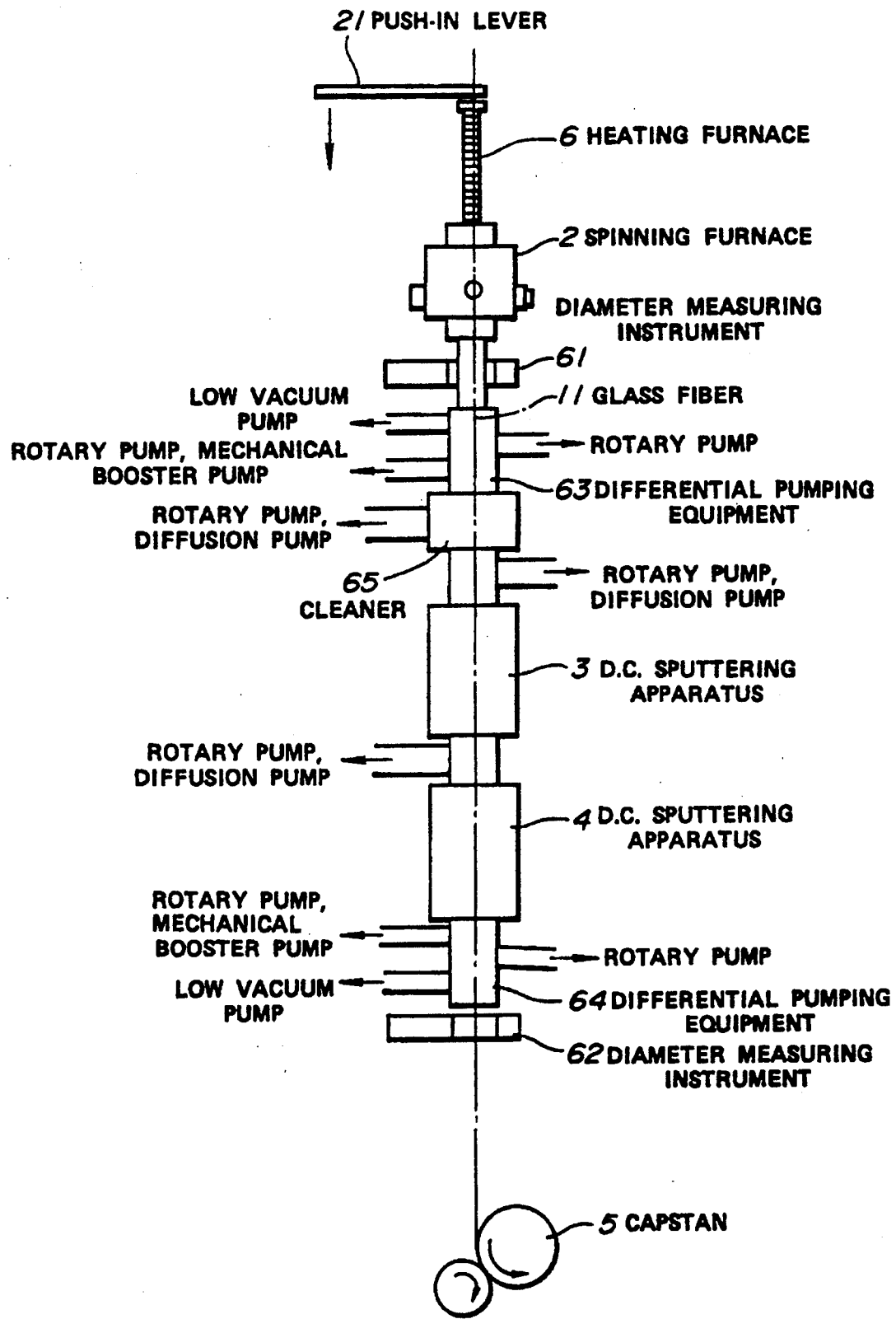
FIG. 2 is a diagrammatic illustration of a production line of the superconducting cable of FIG. 1 with a modified scale.

A unit for fabricating an oxide superconductor cable according to the present invention by sputtering was prepared as illustrated in FIG. 2, in which unit a conventional spinning furnace 2, sputtering furnaces 3 and 4 and a capstan 5 were vertically aligned. A glass fiber 11 spun in the spinning furnace 2 was continuously introduced into the sputtering furnaces 3 and 4 where it was coated with an oxide superconductor film as it was pulled by the capstan 5 for winding. The spinning furnace 2 spun the glass fiber 11 by drawing a molten glass supplied from a heating furnace, into which a preform was pushed by a push-in lever 21 at a predetermined speed. The diameter of the glass fiber 11 was determined by a diameter measuring instrument 61, which provided an electric signal representative of the diameter according to which the push-in speed of the preform was changed by a electronic control unit (not shown) for providing a predetermined diameter. In this example, a silica rod 20 mm diameter was used as the preform and the glass fiber 11 having 125 $\mu$m±2 $\mu$m diameter was spun and pulled at 1 m/min by the capstan 5.

Figure 3:
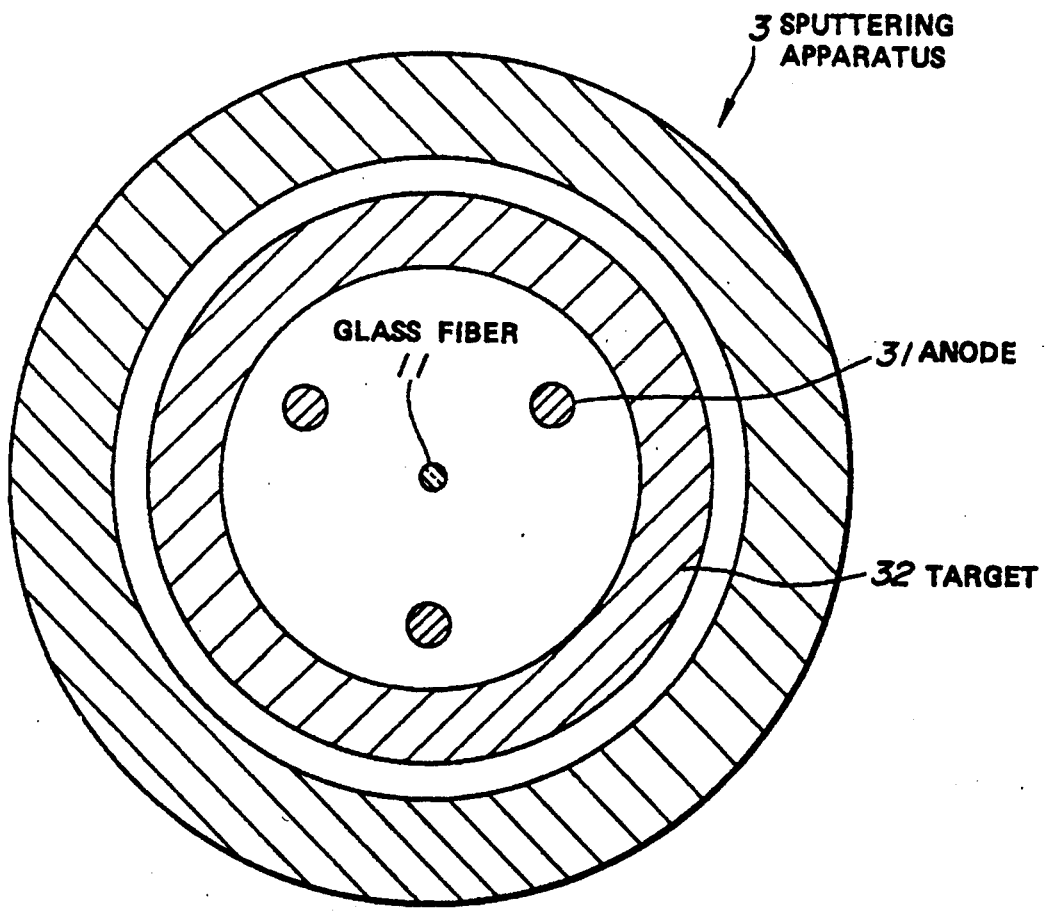
FIG. 3 is an enlarged diagrammatic cross-sectional view of the sputtering apparatus in FIG. 2.

The sputtering apparatus 3 and 4 were respectively communicated to differential pumping devices 63 and 64, which were in turn connected to low vaccum pumps, rotary pumps and mechanical booster pumps. These pumps were arranged so that vacuum degree in the differential pumping devices 63 and 64 became gradually higher towards the sputtering apparatus 3 and 4. A cleaner 65 was interposed between the differential pumping device 63 and the sputtering apparatus 3 for cleaning the surface of the glass fiber 11 by striking generated argon gas plasma against it. The sputtering furnaces 3 and 4 were of the conventional double-hollow cylinder type, in which three anodes 31, 31, 31 were, as illustrated in FIG. 3, arranged around the glass fiber 11 which was suspended through the center of the sputtering apparatus. A hollow cylindrical cathode target 32 was placed around the three anodes 31, 31, 31. The cathode target 32 was made by sintering an oxide powder of $Ba_{0.6}Y_{0.4}CuO_4$ and has an inner diameter 40 mm, outer diameter 50 mm and length 600 mm. In the sputtering furnaces 3 and 4, argon gas was used at a pressure $10^{-3}$ Torr as ion gas. The furnaces 3 and 4 were in the atmosphere including 25% of $O_2$ and 75% of Ar. With such sputtering furnaces 3 and 4, an oxide superconductor thin film was formed by continuous sputtering on the glass fiber of a diameter 125 μm which was spun at a speed of 1 m/min. The oxide superconducting film was controlled to have a thickness 0.5 μm by measuring it with another diameter measuring instrument 62. The superconductor cable exhibited a superconductivity at 85K and the critical current density was 1000 A/cm$^2$.

EXAMPLE 2

A superconducting cable as illustrated in FIG. 4 was prepared by using the fabrication line in FIG. 2 in the same conditions as in Example 1 except that the target 32 of the sputtering apparatus 4 was made of SiO$_2$ for forming a SiO$_2$ sealing layer 13 over the oxide superconducting thin film 12, that the glass fiber 11 was pulled out from the furnace 2 at a speed of 2 m/min, and that the SiO$_2$ layer was coated with a silicone layer 50 μm just after it was formed. The superconductor thin film 12 and the SiO$_2$ layer 13 were 0.3 μm and 0.05 μm in thickness, respectively. The superconducting cable exhibited superconductivity at 85K with a critical current density of 2000 A/cm$^2$.

EXAMPLE 3

Another superconducting cable as illustrated in FIG. 4 was prepared in the same manner and conditions as in Example 2 except that the glass fiber had a diameter 80 μm, that the superconducting thin film 12 was formed by a conventional high frequency sputtering apparatus, and that an indimum sealing layer 13 having a thickness 20 μm was formed at 150° C. by means of a conventional metal dipping apparatus. The finished superconducting cable exhibited superconductivity at 85K with a critical current density of 2000 A/cm$^2$.

EXAMPLE 4

Still another superconducting cable was prepared in the same manner and conditions as in Example 1 except that: the target 32 was of an oxide superconductor material La$_{1.7}$Ca$_{0.3}$CuO; the glass fiber 11 was spun at 2 m/min; a 0.2 μm oxide superconductor material layer was formed over the glass fiber 11 in the sputtering apparatus 3; and the sputtering apparatus 4 was replaced by a D.C. plasma generator which oxidized the superconductor material layer thus formed in the atmosphere in which oxygen was mixed into high frequency plasma generated at a vacuum degree of 2×10$^{-2}$ Torr. The superconductor film 12 was coated with 50 μm silicone layer for preventing H$_2$O, O$_2$ and other gases from outside from adhering to the film 12. The finished superconductor cable showed superconductivity at 35K with a critical current density of 1000 A/cm$^2$.

EXAMPLE 5

A silica glass fiber having a diameter 25 μm was passed through molten Ag for forming a 2 μm Ag coating layer. Then, a YBa$_2$Cu$_3$O$_7$ layer was coated over the Ag coating layer, which was heated at 600° C., by sputtering in the atmosphere including 70% of Ar and 30% of O$_2$ with the sputtering apparatus 3. Thereafter, the glass fiber coated with the YBa$_2$Cu$_3$O$_7$ layer was heat treated at 900° C. for 3 hours. The superconductor thus formed had a critical temperature of 91K and a critical current density of 500 A/cm$^2$ at the temperature of liquid nitrogen in a zero field.

EXAMPLE 6

With the same manner as in Example 5, communication silica glass fiber having 125 μm diameter was coated with 25 μm thick Ag layer and then a YBa$_2$Cu$_3$O$_7$ superconductor layer was formed over the Ag layer. The superconductor had a critical temperature of 91.5K and a critical current density of 530 A/cm$^2$ at the temperature of liquid nitrogen in a zero field.

EXAMPLE 7

In a CO$_2$ laser pulling apparatus, a sapphire fiber of 0.3 mm diameter was heated by applying 15 W CO$_2$ laser beam and drawn into a sapphire single crystal fiber having a diameter 300±5 μm, which was then introduced into a sputtering apparatus as illustrated at 3 in FIG. 2, where it was subjected to sputtering in a 10$^{-3}$ Torr oxidizing atmosphere, including 75% of Ar and 25% of O$_2$, using Ba$_{0.6}$Y$_{0.4}$CuO$_{2.5}$ powder target, while the fiber was axially vibrated at a speed of 0.2 mm/min. Thus, a Ba$_{0.3}$Y$_{0.7}$CuO$_4$ thin film of 0.8 μm thickness was produced and then was coated with a 50 μm silicone coating, so that a superconducting cable having a 1.2 mm length was obtained.

The critical temperature and the critical current density at the temperature of liquid nitrogen in zero field were 90K and 900 A/cm$^2$, respectively.

COMPARATIVE TEST

An oxide superconductor cable was prepared in the same manner and conditions as in Example 5 except that the Ag layer was not provided. The critical temperature and the critical current density at the temperature of liquid nitrogen of the oxide superconductor were 89K and 60 A/cm$^2$, respectively.

What is claimed is:

1. An oxide superconductor cable comprising:
   (a) a fiber having an outer surface; and
   (b) an oxide superconductor layer disposed to cover the outer surface of said fiber, about 0.1 to about 5 μm thick, and represented by the formula:

wherein: A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra; $0.1 \leq x \leq 2.0$; $1 \leq y \leq 3$; $1 \leq z \leq 3$; and $0 \leq \delta \leq 7$, wherein said fiber is made of a material selected from the group consisting of silica glass, multicomponent glass, Al$_2$O$_3$, TiO$_2$, ZrO$_2$, and YAG.

2. An oxide superconductor cable as recited in claim 1, further comprising a sealing layer disposed to cover the oxide superconductor layer for hermetically sealing the oxide superconductor layer, wherein the sealing layer is made of a material selected from the group consisting of In, Ag, Pt, Ru, Rh, Pd, Os, Ir, Cu, Ni, Au and their alloys.

3. An oxide superconductor cable as recited in claim 2, further comprising a coating layer disposed to cover the sealing layer, wherein the coating layer is made of a material selected from the group consisting of silicone and an organic compound.

4. An oxide superconductor cable as recited in claim 1, wherein said fiber is made of a single crystal oxide selected from the group consisting of $Al_2O_3$, $TiO_2$, $ZrO_2$ and yttrium-aluminum-garnet.

5. An oxide superconductor cable according to claim 1, wherein the diameter of the ceramic fiber is between about 20 μm and about 300 μm.

6. An oxide superconductor cable according to claim 1, wherein said fiber is made of optical glass for light transmission for communication.

7. An oxide superconductor cable as recited in claim 1, further comprising a sealing layer applied between said fiber and the oxide superconductor layer for hermetically separating the oxide superconductor layer from said fiber, wherein said sealing layer between said fiber and the oxide superconductor layer is made of a material selected from the group consisting of In, Ag, Pt, Ru, Rh, Pd, Os, Ir, Cu, Ni, Au and their alloys.

8. An oxide superconductor cable according to claim 3, wherein the organic compound is an ultraviolet-setting epoxy acrylate resin.

9. An oxide superconductor cable according to claim 7 further comprising a second sealing layer disposed to cover the oxide superconductor layer for hermetically sealing the superconductor layer from a surrounding atmosphere, and a coating layer disposed to cover the second sealing layer, wherein said second sealing layer is made of a material selected from the group consisting of In, Ag, Pt, Ru, Rh, Pd, Os, Ir, Cu, Ni, Au and their alloys and said coating layer is made of a material selected from the group consisting of silicone and an organic compound.

* * * * *